US010340816B2

(12) United States Patent
Ushijima

(10) Patent No.: US 10,340,816 B2
(45) Date of Patent: Jul. 2, 2019

(54) SEMICONDUCTOR DEVICE AND MULTIPHASE SEMICONDUCTOR DEVICE

(71) Applicant: Mitsubishi Electric Corporation, Tokyo (JP)

(72) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 227 days.

(21) Appl. No.: 15/324,031

(22) PCT Filed: Aug. 29, 2014

(86) PCT No.: PCT/JP2014/072748
§ 371 (c)(1),
(2) Date: Jan. 5, 2017

(87) PCT Pub. No.: WO2016/031052
PCT Pub. Date: Mar. 3, 2016

(65) Prior Publication Data
US 2017/0201188 A1    Jul. 13, 2017

(51) Int. Cl.
*H02M 1/00* (2006.01)
*H02M 1/32* (2007.01)
*H02M 7/00* (2006.01)
*H01L 23/34* (2006.01)
(Continued)

(52) U.S. Cl.
CPC ............ *H02M 7/537* (2013.01); *H01L 23/34* (2013.01); *H01L 25/07* (2013.01); *H01L 25/18* (2013.01);
(Continued)

(58) Field of Classification Search
CPC ........ H02M 7/537; H02M 1/32; H02M 7/003; H02M 2001/0009; H02M 2001/327;
(Continued)

(56) References Cited

U.S. PATENT DOCUMENTS

| | | | |
|---|---|---|---|
| 6,885,096 | B2 | 4/2005 | Hirahara et al. |
| 2002/0024129 | A1 | 2/2002 | Hirahara et al. |

(Continued)

FOREIGN PATENT DOCUMENTS

| | | |
|---|---|---|
| CN | 1333566 A | 1/2002 |
| CN | 101467252 A | 6/2009 |

(Continued)

OTHER PUBLICATIONS

International Search Report issued in PCT/JP2014/072748; dated Dec. 2, 2014.
An Office Action mailed by the State Intellectual Property Office of the People's Republic of China dated Jul. 2, 2018, which corresponds to Chinese Patent Application No. 201480081622.X and is related to U.S. Appl. No. 15/324,031.

*Primary Examiner* — Michael P McFadden
(74) *Attorney, Agent, or Firm* — Studebaker & Brackett PC

(57) ABSTRACT

In the present invention, a lower arm control substrate, an insulation material and an upper arm control substrate are layered to be arranged in this order on a top surface of a small-sized power module. An upper arm main region and a lower arm main region are arranged to overlap the insulation material in plan view, and large parts of the upper arm main region and the lower arm main region overlap each other in plan view. The upper arm control substrate and the upper arm control substrate are configured with substrates of the same structure and the lower arm control substrate has a positional relation with the upper arm control substrate so as to be rotated by 180° from the upper arm control substrate in a horizontal direction.

9 Claims, 5 Drawing Sheets

(51) Int. Cl.
  *H01L 25/07*  (2006.01)
  *H01L 25/18*  (2006.01)
  *H02M 1/084*  (2006.01)
  *H02M 7/537*  (2006.01)
  *H01L 29/739*  (2006.01)

(52) U.S. Cl.
  CPC ........ *H01L 29/7393* (2013.01); *H02M 1/084* (2013.01); *H02M 1/32* (2013.01); *H01L 2924/0002* (2013.01); *H02M 7/003* (2013.01); *H02M 2001/0009* (2013.01); *H02M 2001/327* (2013.01)

(58) Field of Classification Search
  CPC ........ H02M 1/084; H01L 23/34; H01L 25/07; H01L 25/18; H01L 29/7393; H01L 2924/0002
  USPC .......................................................... 361/783
  See application file for complete search history.

(56) References Cited

U.S. PATENT DOCUMENTS

| | | | |
|---|---|---|---|
| 2009/0218666 A1* | 9/2009 | Yang | H01L 21/56 257/677 |
| 2013/0056755 A1 | 3/2013 | Hatai et al. | |
| 2013/0181228 A1* | 7/2013 | Usui | H01L 23/4334 257/77 |

FOREIGN PATENT DOCUMENTS

| CN | 102906874 A | 1/2013 |
|---|---|---|
| JP | 2001-237368 A | 8/2001 |
| JP | 2002-026251 A | 1/2002 |
| JP | 4163360 B2 | 10/2008 |
| JP | 2014-053449 A | 3/2014 |
| WO | 2013/172183 A1 | 11/2013 |

* cited by examiner

SEMICONDUCTOR DEVICE AND MULTIPHASE SEMICONDUCTOR DEVICE

TECHNICAL FIELD

The present invention relates to a semiconductor device for use in a power control apparatus or the like, and in particular, to a control substrate structure thereof.

BACKGROUND ART

A conventional semiconductor device including a module or the like which contains an inverter unit having upper and lower arms is used as an inverter device for driving a drive motor of, for example, an electric vehicle such as an electric car. A semiconductor device having such features as described above is disclosed, for example, in Patent Document 1.

In a configuration of a conventional semiconductor device containing upper and lower arms as described above, in order to ensure an insulation property between the upper arm and the lower arm, insulation between the upper arm as a high-voltage side arm and the lower arm as a low-voltage side arm should be required as a matter of course, and also when two control substrates for the upper arm and the lower arm are provided on the same base, in order to ensure an insulation property between the two control substrates, the substrates should be arranged with an insulation area provided therebetween, which restricts a reduction in size of the two control substrates in a plane direction.

PRIOR ART DOCUMENT

Patent Documents

Patent Document 1: Japanese Patent Application Laid-Open No. 2002-26251

SUMMARY OF INVENTION

Problems to be Solved by the Invention

Under current circumstances where development of an SiC element or the like accelerates an increase in a current density and a reduction of a power module in size, in a conventional semiconductor device having the above-described features, an insulation area should be provided also between two control substrates for an upper arm and a lower arm, so that a reduction of a base in size in a plane direction is restricted to make it disadvantageously impossible to reduce the device in size while ensuring an insulation breakdown voltage between the upper and lower arms including the control substrates.

An object of the present invention is to solve the above-described problem and provide a semiconductor device which can be reduced in size while ensuring an insulation property between circuits requiring insulation.

Means for Solving the Problems

A semiconductor device according to the present invention includes a semiconductor module internally having first and second partial circuit units and externally having first and second external terminals for the first and second circuit units; first and second control substrates which are arranged on the semiconductor module and on which first and second control circuits for the first and second partial circuit units are provided, the first and second control substrates having first and second main regions on which first and second control main portions are formed; and an insulation material inserted between the first and second control substrates so as to overlap the first and second main regions in plan view, in which the first and second control substrates further have first and second protrusion regions in which first and second circuit parts electrically connected to the first and second external terminals are formed, the first control circuit includes the first circuit part and the first control main portion, and the second control circuit includes the second circuit part and the second control main portion.

Effects of the Invention

The first and second main regions of the first and second control substrate in the semiconductor device as the invention of the present application are arranged so as to overlap the insulation material in plan view. Therefore, as a result of layering the first and second control substrates such that large parts of the first and second main regions overlap in plan view, an area occupied by the first and second control substrates can be decreased to realize a reduction of the device in size as a whole.

In addition, according to the invention of the present application, due to presence of an insulation material inserted between the first and second control substrates so as to overlap the first and second main regions in plan view, at least a part between the first and second control main portions can be insulated by the insulation material to produce an effect of ensuring excellent insulation performance between the first and second control circuits.

Objects, features, aspects and advantages of the present invention will become apparent from the following detailed description and accompanying drawings.

DESCRIPTION OF EMBODIMENTS

<Antecedent Technique>

Figure 6:
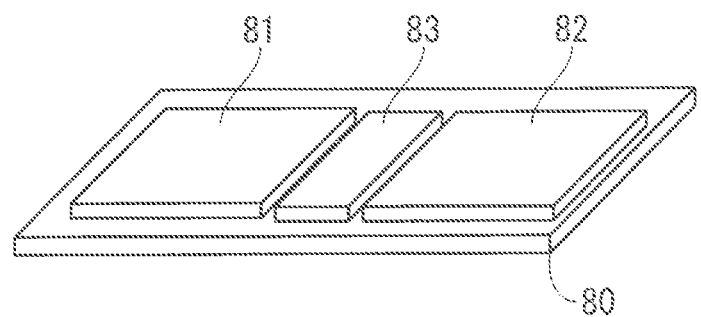
FIG. 6 is a perspective view showing a configuration example of the above-described conventional semiconductor device containing upper and lower arms.

FIG. 6 is a perspective view showing a configuration example of the above-described conventional semiconductor device containing upper and lower arms. As illustrated in the figure, on a top surface of a semiconductor module 80 containing an inverter unit having an upper arm unit and a lower arm unit, an upper arm control circuit 81 and a lower arm control circuit 82 are formed with an insulation area 83 provided between the circuits 81 and 82. The upper arm control circuit 81 is a control circuit for the upper arm unit and the lower arm control circuit 82 is a control circuit for the lower arm unit. The upper arm unit as a high-voltage side arm unit has a P terminal to which a high voltage VH is applied as an external terminal and the lower arm unit as a low-voltage side arm unit has an N terminal to which a low voltage VL(<VH) is applied as an external terminal. The semiconductor module 80, the upper arm control circuit 81, the lower arm control circuit 82 and the insulation area 83 as illustrated in FIG. 6 can obtain a semiconductor device which will be an IPM (Intelligent Power Module).

In particular, when as a high voltage and large current power module, a semiconductor device is configured including an inverter unit having upper and lower arms, an insulation breakdown voltage between the upper arm unit and the lower arm unit should be ensured including a switching surge, so that as illustrated in FIG. 6, provision of the insulation area 83 between the upper arm control circuit 81 and the lower arm control circuit 82 is indispensable.

As a result, a reduction in a surface area of the semiconductor module 80 is restricted to cause a problem that a size of the device cannot be reduced as a whole. Solution of this problem is provided by the following exemplary embodiments.

<First Exemplary Embodiment>

Figure 1:
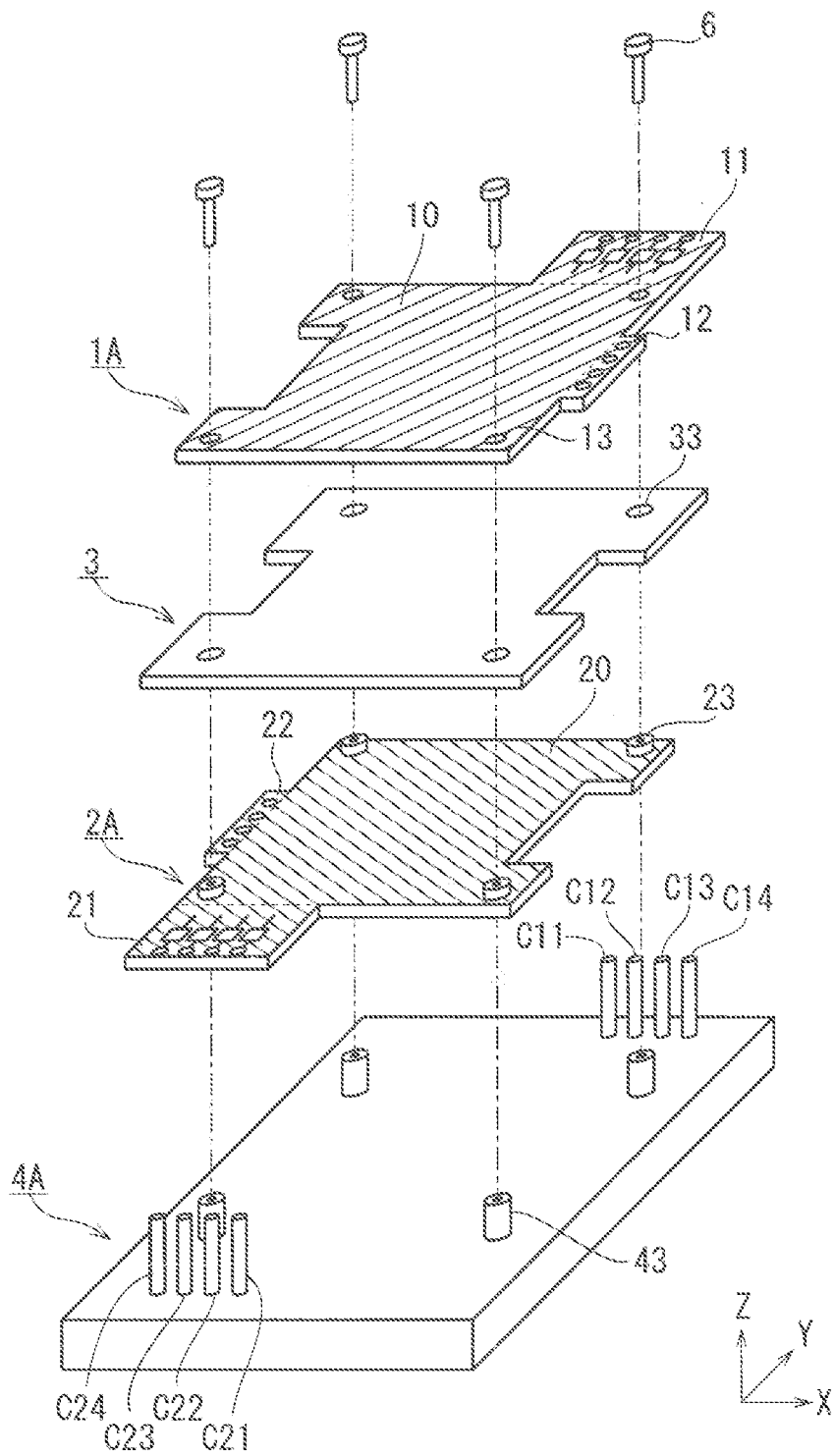
FIG. 1 is an explanatory view showing a structure of a semiconductor device according to a first exemplary embodiment of the present invention.
Figure 2:
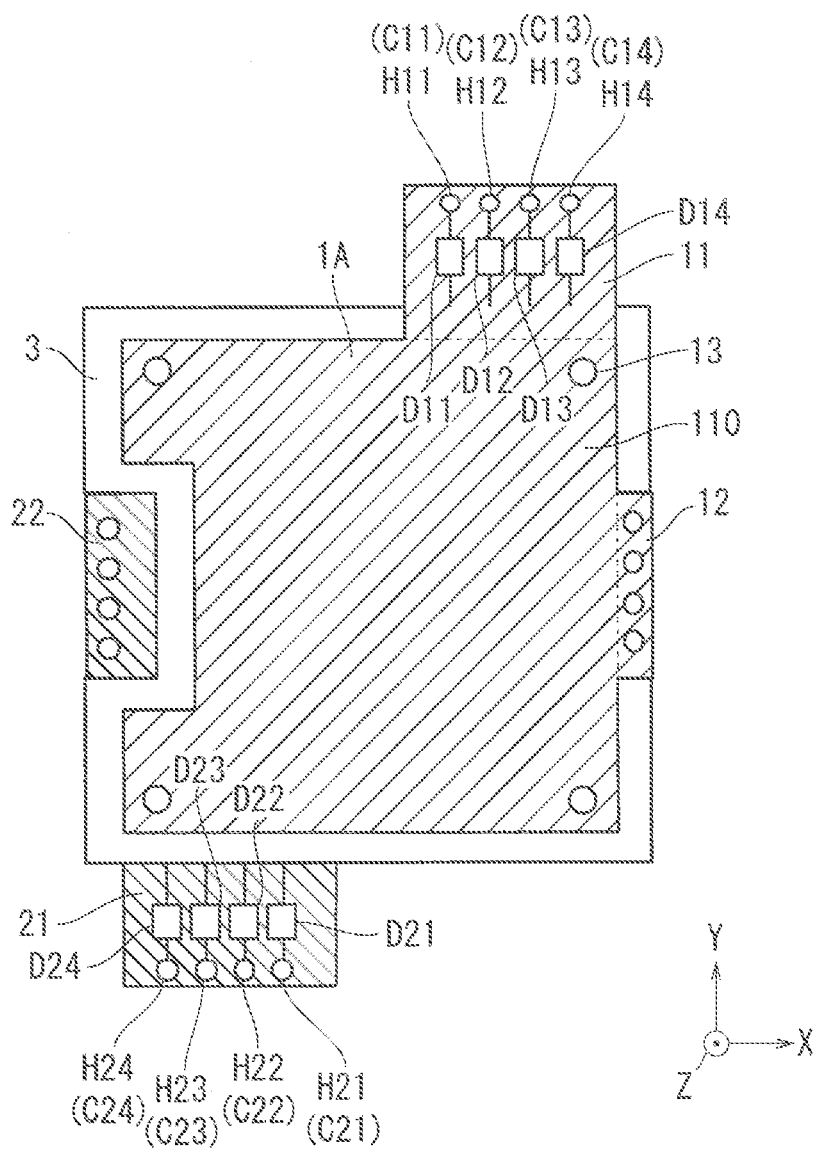
FIG. 2 is a plan view showing a plane structure between upper and lower arm control substrates in FIG. 1.

FIG. 1 is an explanatory view showing a structure of a semiconductor device according to a first exemplary embodiment of the present invention, and FIG. 2 is a plan view showing a plane structure between an upper arm control substrate 1A and a lower arm control substrate 2A illustrated in FIG. 1. In FIG. 1, the structure of the semiconductor device according to the first exemplary embodiment is illustrated in a form of assembly steps, and an orthogonal coordinate system XYZ is illustrated in each of FIG. 1 and FIG. 2.

A small-sized power module 4A (semiconductor module) internally has an upper arm unit as a high-voltage side arm unit not shown and a lower arm unit as a low-voltage side arm unit (first and second partial circuit units). The upper arm unit and the lower arm unit each has a power semiconductor element such as IGBT or the like, and a combination of the upper arm unit and the lower arm unit configures single unit of an inverter unit. The small-sized power module 4A further has upper arm control terminals C11 to C14 for the upper arm unit and lower arm control terminals C21 to C24 for the lower arm unit which are formed to protrude from inside the small-sized power module 4A beyond a top surface thereof.

The upper arm control terminals C11 to C14 present on a front side (+Y direction) on the top surface of the small-sized power module 4A are arranged in the order of C11, C12, C13 and C14 (an external terminal arrangement order) in a right direction (+X direction) from a central portion toward a corner portion.

The lower arm control terminals C21 to C24 present on a rear side (−Y direction) on the top surface of the small-sized power module 4A are arranged in the order of C21, C22, C23 and C24 (the external terminal arrangement order) in a left direction (−X direction) from the central portion toward the corner portion.

Thus, on the top surface of the small-sized power module 4A, the upper arm control terminals C11 to C14 are arranged on a front right side (+Y direction and +X direction side) and the lower arm control terminals C21 to C24 are arranged on a rear left side (−Y direction and −X direction side). Specifically, on the top surface of the small-sized power module 4A, the upper arm control terminals C11 to C14 and the lower arm control terminals C21 to C24 have a positional relation (first external terminal positional relation) in which the terminals are spaced apart from each other to be diagonally provided at end portions facing to each other in plan view.

On the top surface of the small-sized power module 4A, the lower arm control substrate 2A, an insulation material 3 and the upper arm control substrate 1A are layered to be arranged in the order of the lower arm control substrate 2A, the insulation material 3 and the upper arm control substrate 1A.

The upper arm control substrate 1A has an upper arm main region 10, an upper arm protrusion region 11 and an upper arm protrusion region 12. The upper arm main region 10 occupies a large part of the upper arm control substrate 1A excluding the upper arm protrusion region 11 and the upper arm protrusion region 12. The upper arm protrusion region 11 is formed at the right side on the front end (the +Y direction and +X direction side) of the upper arm main region 10 so as to protrude forward (the +Y direction) in the figure, and the upper arm protrusion region 12 is formed at the central portion of a right end of the upper arm main region 10 in the figure so as to protrude therefrom to the right direction in the figure.

Then, in the upper arm main region 10, a main portion of an upper arm control circuit for the upper arm unit (not shown, and abbreviated as "upper arm control main portion" (first control main portion) in the following) is formed, and on an top surface of the upper arm protrusion region 11, upper arm parts D11 to D14 (first circuit parts) electrically connected to the upper arm control terminals C11 to C14 are formed. The upper arm protrusion region 12 is a region for connection with an external power source and an external signal.

Thus, the upper arm control circuit formed on the upper arm control substrate 1A is configured to include the upper arm control main portion and the upper arm parts D11 to D14. The upper arm control main portion is formed on at least one of a top surface and a back surface of the upper arm main region 10. Additionally, the upper arm parts D11 to D14 may be formed on a back surface of the upper arm protrusion region 11.

The lower arm control substrate 2A has a lower arm main region 20, a lower arm protrusion region 21 and a lower arm protrusion region 22. The lower arm main region 20 occupies a large part of the lower arm control substrate 2A excluding the lower arm protrusion region 21 and the lower arm protrusion region 22. The lower arm protrusion region 21 is formed at the left side on the rear end in the figure (the −Y direction and −X direction side) so as to protrude backward (the −Y direction) from the lower arm main region 20 in the figure, and the lower arm protrusion region 22 is formed at a central portion of a left end of the lower arm main region 20 in the figure so as to protrude therefrom to the left direction in the figure.

As described above, the upper arm protrusion region 11 formed at the right side on the front end so as to protrude therefrom and the lower arm protrusion region 21 formed at the left side on the rear end so as to protrude therefrom have a positional relation of opposed protrusion regions in which the regions are spaced apart from each other to be diagonally provided at end portions facing to each other in plan view.

Then, in the lower arm main region 20, a main portion of a lower arm control circuit for the lower arm unit (not shown, and abbreviated as "lower arm control main portion" (second control main portion) in the following) is formed, and on a top surface of the lower arm protrusion region 21, lower arm parts D21 to D24 (second circuit parts) electrically connected to the lower arm control terminals C21 to C24 are formed. The lower arm protrusion region 22 is a region for connection with an external power source and an external signal.

Thus, the lower arm control circuit formed on the lower arm control substrate 2A is configured to include the lower arm control main portion and the lower arm parts D21 to D24. The lower arm control main portion is formed on at least one of a top surface and a back surface of the lower arm main region 20. Additionally, the lower arm parts D21 to D24 may be formed on a back surface of the lower arm protrusion region 21.

Figure 3:
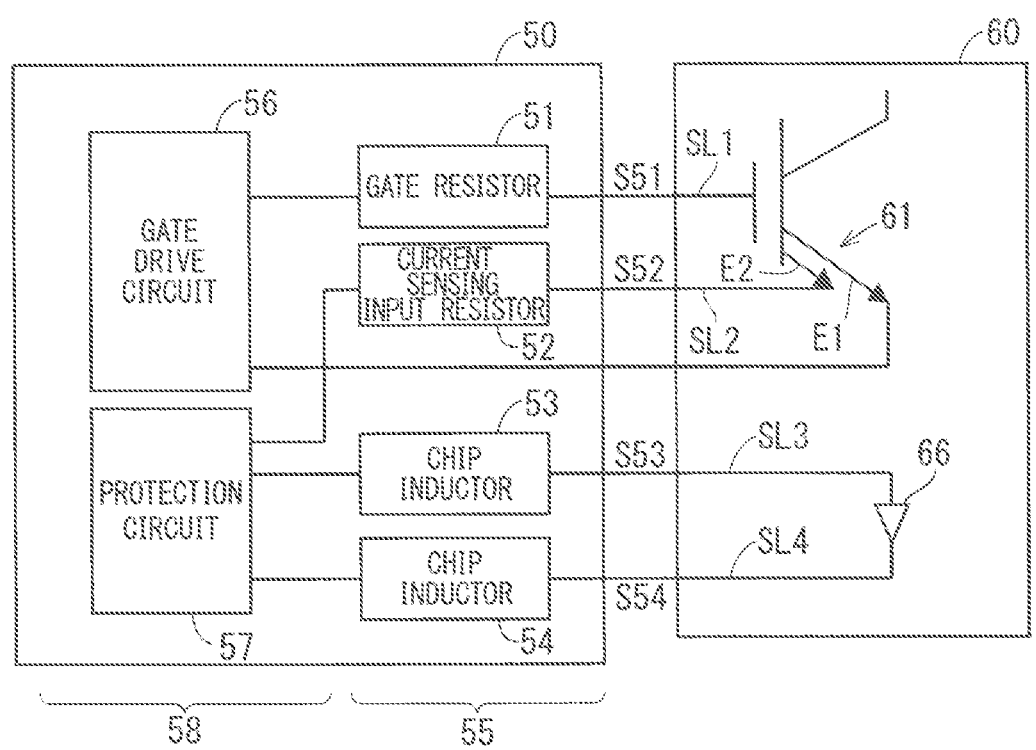
FIG. 3 is an explanatory diagram showing a specific example of a control circuit unit formed on the upper arm control substrate and an arm unit formed in a small-sized power module.

FIG. 3 is an explanatory diagram showing a specific example of a control circuit unit 50 formed on a top surface or a back surface, or on both the top surface and the back surface of the upper arm control substrate 1A (the lower arm control substrate 2A) and an arm unit 60 formed in the small-sized power module 4A. The control circuit unit 50 corresponds to the upper arm control circuit or the lower arm control circuit formed on the upper arm control substrate 1A or the lower arm control substrate 2A, respectively, and the arm unit 60 corresponds to the upper arm unit or the lower arm unit.

As illustrated in the figure, the control circuit unit 50 includes a group of circuit parts 55 configured with a gate resistor 51, a current sensing input resistor 52 and chip inductors 53 and 54, and a main circuit unit 58 configured with a gate drive circuit 56 and a protection circuit 57. Accordingly, the upper arm parts D11 to D14 and the lower arm parts D21 to D24 correspond to the group of circuit parts 55 and the upper arm control main portion and the lower arm control main portion correspond to the control circuit unit 58.

On the other hand, the arm unit 60 has an IGBT 61 as a power semiconductor element, and a temperature sensing diode 66. One unit of an inverter unit can be configured by such wiring of connecting the IGBT 61 of the arm unit 60 corresponding to the upper arm unit and the IGBT 61 of the arm unit 60 corresponding to the lower arm unit in series, connecting, to a collector of the IGBT 61 in the upper arm unit (high-voltage side arm unit), a P terminal to which a high voltage VH is applied, and connecting, to an emitter of the IGBT 61 in the lower arm unit (low-voltage side arm unit), an N terminal to which a low voltage VL(<VH) is applied. The temperature sensing diode 66 is provided for detecting a chip temperature.

An output signal from the gate drive circuit 56 is applied to a gate electrode of the IGBT 61 as a control signal S51 for the IGBT 61 via the gate resistor 51. A signal obtained from a main emitter terminal El of the IGBT 61 is applied to the gate drive circuit 56. A control signal S52 obtained from a current sensing emitter terminal E2 of the IGBT 61 is applied to the protection circuit 57 via the current sensing input resistor 52.

The protection circuit 57 is electrically connected to an anode of the temperature sensing diode 66 via the chip inductor 53 and electrically connected to a cathode of the temperature sensing diode 66 via the chip inductor 54. A signal between the chip inductor 53 and the anode of temperature sensing diode 66 will be a control signal S53 and a signal between the chip inductor 54 and the cathode of the temperature sensing diode 66 will be a control signal S54.

The protection circuit 57 recognizes a temperature of the arm unit 60 and an emitter current amount of the IGBT 61 based on the control signals S52 to S54 to conduct protection operation of the IGBT 61 when such abnormality is detected as overcurrent, overheat or the like of the arm unit 60. Possible as the protection operation is such operation of driving the gate drive circuit 56 to output the control signal S51 which instructs the gate electrode of the IGBT 61 to be off.

In the above-described configuration, the upper arm parts D11 to D14 (lower arm parts D21 to D24) each correspond to any of the gate resistor 51, the current sensing input resistor 52, and the chip inductors 53 and 54, and control terminals (not shown in FIG. 3) on the side of the arm unit 60 for transmitting and receiving the control signals S51 to S54 propagating on control signal lines SL1 to SL4 correspond to the upper arm control terminals C11 to C14 (lower arm control terminals C21 to C24). The control signal lines SL1 to SL4 are provided nearest to the upper arm control terminals C11 to C14 (lower arm control terminals C21 to C24) to facilitate electrical connection therebetween by soldering or the like.

Returning to FIG. 1 and FIG. 2, the upper arm control substrate 1A and the lower arm control substrate 2A are configured with substrates of the same structure and have a positional relation (first control substrate positional relation) in which the lower arm control substrate 2A is arranged on the small-sized power module 4A in a state of being rotated from the upper arm control substrate 1A by 180° around the vicinity of the center of the upper arm main region 10 in a horizontal direction (on an XY plane).

Then, between the upper arm control substrate 1A and the lower arm control substrate 2A, the upper arm main region 10 corresponds to the lower arm main region 20, the upper arm protrusion region 11 to the lower arm protrusion region 21, and the upper arm protrusion region 12 to the lower arm protrusion region 22 on a one-to-one basis.

As illustrated in FIG. 1 and FIG. 2, the insulation material 3 is arranged so as to overlap the upper arm main region 10 of the upper arm control substrate 1A and the lower arm main region 20 of the lower arm control substrate 2A at least in plan view.

Additionally, the upper arm main region 10 and the lower arm main region 20 also have a positional relation in which a large part of the regions overlap in plan view.

On the other hand, the upper arm protrusion region 11 and the upper arm protrusion region 12 of the upper arm control substrate 1A each protrude so as to have an upper portion thereof exposed without overlapping the insulation material 3 and the lower arm control substrate 2A in plan view. Similarly, the lower arm protrusion region 21 and the lower arm protrusion region 22 of the lower arm control substrate 2A each protrude so as to have an upper portion thereof exposed without overlapping the insulation material 3 and the upper arm control substrate 1A in plan view.

As illustrated in FIG. 1, relative to four screw fixing bushes 43 having a positional relation so as to be provided at respective vertexes of a rectangle on the top surface of the small-sized power module 4A, spacers with through hole for screw 23 provided at four corners of the lower arm main region 20 of the lower arm control substrate 2A, through holes for screw 33 provided at four corners of the insulation material 3, and through holes for screw 13 provided at four corners of the upper arm main region 10 of the upper arm control substrate 1A are arranged in conformity in plan view. Then, from above the upper arm control substrate 1A, four screws 6 are passed through the through holes for screws 13, 33, and the through holes of the spacers with through hole for screw 23 to be then screwed into fixing holes of the screw fixing bushes 43, thereby jointly fastening and fixing the lower arm control substrate 2A, the insulation material 3 and the upper arm control substrate 1A on the small-sized power module 4A. As a result, a semiconductor device as an IPM is obtained which includes the upper arm control substrate 1A, the lower arm control substrate 2A, the insulation material 3 and the small-sized power module 4A.

On this occasion, as illustrated in FIG. 2, the upper arm control terminals C11 to C14 of the small-sized power module 4A are passed through through holes for control terminal H11 to H14 provided in the upper arm protrusion region 11, while the lower arm control terminals C21 to C24 of the small-sized power module 4A are passed through through holes for control terminal H21 to H24 provided in the lower arm protrusion region 21. As a result, front end regions of the upper arm control terminals C11 to C14 are arranged to protrude above the upper arm protrusion region 11 and front end regions of the lower arm control terminals C21 to C24 are arranged to protrude above the lower arm protrusion region 21.

Then, electrical connection between the arm control terminals C11 to C14 and the upper arm parts D11 to D14 (control signal lines electrically connected to terminals of the parts) and electrical connection between the lower arm control terminals C21 to C24 and the lower arm parts D21 to D24 are made by soldering or the like.

The through hole for screw 33 provided in the insulation material 3 is formed to have a size allowing the spacer with through hole for screw 23 on the lower arm control substrate 2A to pass through, and presence of the spacer with through hole for screw 23 prevents pressure from being applied on a (electronic) part formed on the back surface (lower surface) of the upper arm control substrate 1A and on a part on a top surface (upper surface) of the lower arm control substrate 2A when the substrates are jointly fastened by the above-described screw 6.

As illustrated in FIG. 2, the insulation material 3 is inserted between the upper arm control substrate 1A and the lower arm control substrate 2A in such a form and a manner that relative to the upper arm control substrate 1A and the lower arm control substrate 2A, the insulation material overlaps the upper arm main region 10 and the upper arm protrusion region 11 in plan view and does not overlap the upper arm protrusion region 11 and the upper arm protrusion region 12, and the lower arm protrusion region 21 and the lower arm protrusion region 22 in plan view.

As described above, the insulation material 3 exhibits an external shape that enables a sufficient insulation creepage surface (distance) to be ensured between the upper arm control substrate 1A (upper arm main region 10) and the lower arm control substrate 2A (lower arm main region 20).

The upper arm parts D11 to D14 and the lower arm parts D21 to D24 are circuit parts for the upper arm control circuit and the lower arm control circuit to be arranged nearest to the control terminals of the upper arm unit and the lower arm unit, such as a resistor for gate, a chip inductor or the like as described above. Arrangement of these upper arm parts D11 to D14 and lower arm parts D21 to D24 on the upper arm protrusion region 11 and the lower arm protrusion region 21 which do not interfere with the insulation material 3 facilitates a change of a multiplier (indicating an electric characteristic such as a resistor value, an inductance or the like) and the like after assembly as will be described later.

The upper arm main region 10 and the lower arm main region 20 (the first and second main regions) of the upper arm control substrate 1A and the lower arm control substrate 2A (the first and second control substrates), respectively, in the first exemplary embodiment, are arranged so as to overlap the insulation material 3 in plan view. Therefore, as a result of layering of the upper arm control substrate 1A and the lower arm control substrate 2A in a manner that large parts of the upper arm main region 10 and the lower arm main region 20 overlap in plan view, an area occupied by the upper arm control substrate 1A and the lower arm control substrate 2A can be decreased to realize a reduction of the device in size as a whole.

In addition, the first exemplary embodiment produces an effect of ensuring insulation performance having a high insulation resistance between the upper arm control circuit and the lower arm control circuit because due to presence of the insulation material 3 arranged between the upper arm control substrate 1A and the lower arm control substrate 2A so as to overlap the upper arm main region 10 and the lower arm main region 20 in plan view, at least insulation between the upper arm control main portion and the lower arm control main portion can be obtained by the insulation material 3.

Further, since the upper arm protrusion region 11 and the lower arm protrusion region 21 do not overlap each other in plan view, and do not overlap the insulation material 3 in plan view either and have the top surfaces exposed, such assembly steps can be conducted with relative ease as arrangement and replacement of the upper arm parts D11 to D14 and the lower arm parts D21 to D24 formed on the top surfaces of the upper arm protrusion region 11 and the lower arm protrusion region 21, respectively. As a result, by changing a multiplier that instructs an electric characteristics of the upper arm parts D11 to D14 and the lower arm parts D21 to D24, the semiconductor device of the first exemplary embodiment is allowed to realize various operation characteristics with relative ease by appropriately changing operation characteristics of the upper arm control circuit and the lower arm control circuit so as to satisfy a user's use condition such as switching surge reduction or the like.

Further, because the same substrate can be used for the upper arm control substrate 1A and for the lower arm control substrate 2A, manufacturing costs of the upper arm control substrate 1A and the lower arm control substrate 2A can be reduced accordingly, thereby cutting a cost of the device as a whole.

Additionally, in the semiconductor device of the first exemplary embodiment, the upper arm control terminals C11 to C14 and the lower arm control terminals C21 to C24 (the first and second external terminals) have the first external terminal positional relation in which the terminals are spaced apart from each other to be diagonally provided at the end portions facing to each other on the top surface of the small-sized power module 4A in plan view.

On the other hand, the upper arm control substrate 1A and the lower arm control substrate 2A have the same plane shape as a whole, and have the first control substrate positional relation in which relative to one substrate, the other substrate is rotated by 180° in the horizontal direction (on the XY plane).

The upper arm protrusion region 11 and the lower arm protrusion region 21, which are respectively formed on the upper arm control substrate 1A and the lower arm control substrate 2A having the above first control substrate positional relation, have a positional relation of opposed protrusion regions in which the regions are spaced apart from each other to be diagonally provided at the end portions facing to each other in plan view as described above. Specifically, as illustrated in FIG. 2, the upper arm protrusion region 11 is arranged at the right side on the front end (+Y, +X direction side) in plan view, and the lower arm protrusion region 21 is arranged at the left side on the rear end (−Y, −X direction side) in plan view.

Accordingly, having the first external terminal positional relation in which the terminals are spaced apart from each other to be diagonally provided at the end portions facing to each other on the small-sized power module 4A in plan view allows the upper arm control terminals C11 to C14 and the lower arm control terminals C21 to C24 to be in conformity with the above positional relation of opposed protrusion regions. As a result, electrical connection can be made with relative ease between the upper arm control terminals C11 to C14 and the upper arm parts D11 to D14 provided on the upper arm protrusion region 11 and between the lower arm control terminals C21 to C24 and the lower arm parts D21 to D24 provided on the lower arm protrusion region 21, thereby enabling reduction in a manufacturing cost.

Thus, in the semiconductor device of the first exemplary embodiment, the upper arm control substrate 1A and the lower arm control substrate 2A are provided which can be reduced in size and can be mounted on the small-sized power module 4A as a small-sized two-in-one module having the upper and lower arm control terminals (C11 to C14, C21 to C24) at opposite angles.

Additionally, in the small-sized power module 4A, the upper arm unit and the lower arm unit (the first and second partial circuit units) configure single unit of the inverter unit for a single phase. Accordingly, the configuration of the semiconductor device of the first exemplary embodiment as an IPM containing single unit of the inverter unit and the control circuits thereof (the upper arm control circuit and the lower arm control circuit) enables a reduction of the device in size and improvement in insulation performance between the upper arm control circuit and the lower arm control circuit.

<Second Exemplary Embodiment>

Figure 4:
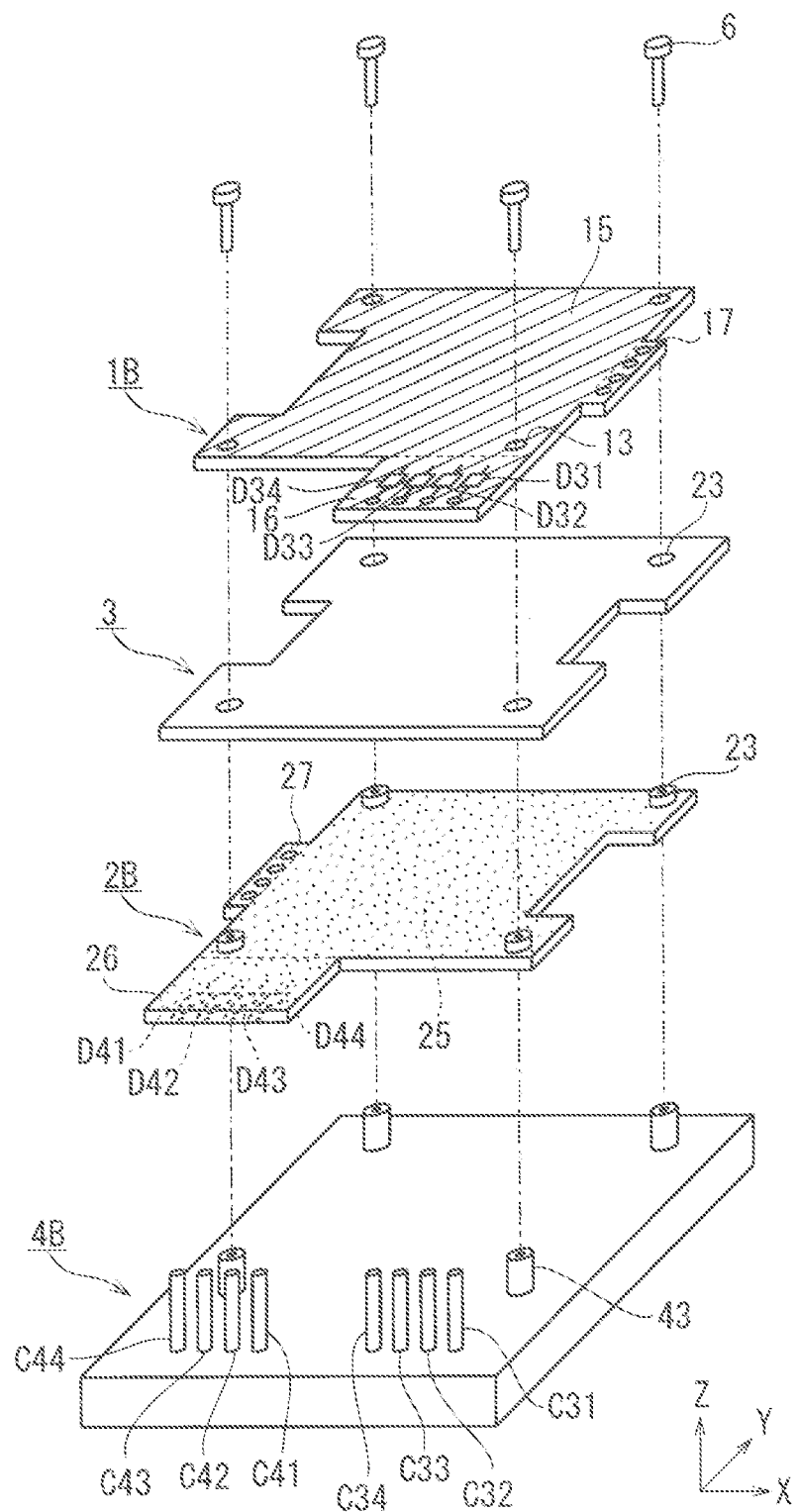
FIG. 4 is an explanatory view showing a structure of a semiconductor device according to a second exemplary embodiment of the present invention.

FIG. 4 is an explanatory view showing a structure of a semiconductor device according to a second exemplary embodiment of the present invention. In FIG. 4, the structure of the semiconductor device according to the second exemplary embodiment is illustrated in a form of assembly steps. An orthogonal coordinate system XYZ is illustrated in FIG. 4. Hereinafter, the same structures and functions as those of the semiconductor device according to the first exemplary embodiment illustrated in FIG. 1 and FIG. 2 are allotted the same reference numerals to appropriately omit description thereof for convenience of explanation.

A small-sized power module 4B (semiconductor module) internally has an upper arm unit as a high-voltage side arm unit and a lower arm unit as a low-voltage side arm unit (first and second partial circuit units), in which upper arm control terminals C31 to C34 for the upper arm unit and lower arm control terminals C41 to C44 for the lower arm unit are formed to protrude externally from inside of the small-sized power module 4B.

The upper arm control terminals C31 to C34 present in the rear (−Y direction) on a top surface of the small-sized power module 4B are arranged in the order of C31, C32, C33 and C34 (the order of arrangement of external terminals) along a direction (−X direction; a first direction) from a corner portion toward a central portion.

The lower arm control terminals C41 to C44 present in the rear on the top surface of the small-sized power module 4B are arranged in the order of C41, C42, C43 and C44 (the external terminal arrangement order) along the direction (−X direction; the first direction) from the central portion toward the corner portion.

Thus, on the top surface of the small-sized power module 4B, the upper arm control terminals C31 to C34 are arranged at the right side on the rear end (−Y direction and +X direction side) and the lower arm control terminals C41 to C44 are arranged at the left side on the rear end (−Y direction and −X direction side). Specifically, on the top surface of the small-sized power module 4B, the upper arm control terminals C31 to C34 and the lower arm control terminals C41 to C44 have a positional relation (a second external terminal positional relation) in which the terminals are provided at end portions in the same direction (−Y direction) without overlapping each other in plan view.

On the top surface of the small-sized power module 4B, a lower arm control substrate 2B, an insulation material 3 and an upper arm control substrate 1B are layered to be arranged in the order of the lower arm control substrate 2B, the insulation material 3 and the upper arm control substrate 1B. Both the upper arm control substrate 1B and the lower arm control substrate 2B are a one-side mounting substrate in which circuits are mounted only on a top surface thereof.

The upper arm control substrate 1B has an upper arm main region 15, an upper arm protrusion region 16 and an upper arm protrusion region 17. The upper arm main region 15 occupies a large part of the upper arm control substrate 1B excluding the upper arm protrusion region 16 and the upper arm protrusion region 17. The upper arm protrusion region 16 is formed at the right side on the rear end (the −Y direction and +X direction) so as to protrude backward (the −Y direction) from the upper arm main region 15 in the figure, and the upper arm protrusion region 17 is formed at the central portion of the right end in the figure so as to protrude from the upper arm main region 15 to a right direction in the figure.

On a top surface of the upper arm main region 15, a main portion of an upper arm control circuit for the upper arm unit (not shown, and abbreviated as "upper arm control main portion" (first control main portion) in the following) is formed, and on a top surface (upper surface) of the upper arm protrusion region 16, upper arm parts D31 to D34 (first circuit parts) electrically connected to the upper arm control terminals C31 to C34 are formed. Additionally, the upper arm protrusion region 17 is a region for connection with an external power source and an external signal.

Thus, the upper arm control circuit formed on the upper arm control substrate 1B is configured to include the upper arm control main portion and the upper arm parts D31 to D34. The upper arm parts D31 to D34 are arranged along a left direction in the figure (−X direction; the first direction) in the figure in the order of D31, D32, D33 and D34.

The lower arm control substrate 2B has a lower arm main region 25, a lower arm protrusion region 26 and a lower arm protrusion region 27. The lower arm main region 25 occupies a large part of the lower arm control substrate 2B excluding the lower arm protrusion region 26 and the lower arm protrusion region 27. The lower arm protrusion region 26 is formed at the left side on the rear end in the figure (the −Y direction and −X direction side) so as to protrude backward (the −Y direction) from the lower arm main region 25 in the figure, and the lower arm protrusion region 27 is formed at a central portion of a left end in the figure so as to protrude from the lower arm main region 25 to the left direction in the figure.

In the lower arm main region 25, a main portion of a lower arm control circuit for the lower arm unit (not shown, and abbreviated as "lower arm control main portion" (second control main portion) in the following) is formed, and on a top surface (lower surface) of the lower arm protrusion region 26, lower arm parts D41 to D44 (second circuit parts) electrically connected to the lower arm control terminals C41 to C44 are formed. Additionally, the lower arm protrusion region 27 is a region for connection with an external power source and an external signal.

Thus, the lower arm control circuit formed on the lower arm control substrate 2B is configured to include the lower arm control main portion and the lower arm parts D41 to D44. The lower arm parts D41 to D44 provided on a top surface (lower surface) of the lower arm control substrate 2B are arranged along the right direction (+X direction) in the figure in the order of D41, D42, D43 and D44. Accordingly, when the lower arm control substrate 2B is arranged on the small-sized power module 4B so as to have the top surface facing upward, the lower arm parts D41 to D44 are arranged along the left direction (−X direction; the first direction) in the figure in the order of D41, D42, D43 and D44.

In the relation between the upper arm parts D31 to D34 and the lower arm parts D41 to D44, an upper arm part D3$i$ ($i$=any of 1 to 4) and a lower arm part D4$i$ will be parts (a gate resistor, a balance resistor, a part for on-chip sensor input/output, a chip inductor, a zero ohm resistor for connection, etc.) of the same kind having same multiplier as an electric characteristic value. Accordingly, both the upper arm parts D31 to D34 and the lower arm parts D41 to D44 will be arranged on the top surfaces of the upper arm control substrate 1B and the lower arm control substrate 2B along the left direction (the first direction) in a common circuit part arrangement order.

The upper arm control substrate 1B and the lower arm control substrate 2B are configured with substrates of the same structure, i.e. have the same plane shape as a whole including the upper arm parts D31 to D34 and the lower arm parts D41 to D44, and have a positional relation (a second control substrate positional relation) in which the respective substrates are arranged on the small-sized power module 4B so as to have the top surfaces and back surfaces reversed to each other. Specifically, the upper arm control substrate 1B is arranged to have the top surface thereof facing upward (+Z direction). On the other hand, as a result of arrangement of the lower arm control substrate 2B being rotated by 180° around a virtual rotation axis extending in the Y direction from the state of the upper arm control substrate 1B, the lower arm control substrate 2B is arranged to have the top surface thereof facing downward (−Z direction).

Then, between the upper arm control substrate 1B and the lower arm control substrate 2B, the upper arm main region 15 corresponds to the lower arm main region 25, the upper arm protrusion region 16 to the lower arm protrusion region 26, and the upper arm protrusion region 17 to the lower arm protrusion region 27 on a one-to-one basis.

As illustrated in FIG. 4, the insulation material 3 is arranged so as to overlap the upper arm main region 15 of the upper arm control substrate 1B and the lower arm main region 25 of the lower arm control substrate 2B in plan view.

On the other hand, the upper arm protrusion region 16 and the upper arm protrusion region 17 of the upper arm control substrate 1B each protrude so as to have a top surface of an upper portion thereof exposed without overlapping the insulation material 3 and the lower arm control substrate 2B in plan view. Similarly, the lower arm protrusion region 26 and the lower arm protrusion region 27 of the lower arm control substrate 2B each protrude so as to have a back surface of an upper portion thereof exposed without overlapping the insulation material 3 and the upper arm control substrate 1B in plan view.

As illustrated in FIG. 4, similarly to the first exemplary embodiment, from above the upper arm control substrate 1B, four screws 6 are passed through through holes for screw 13, 33, and through holes of spacers with through hole for screw 23 to be then screwed into fixing holes of screw fixing bushes 43, thereby jointly fastening and fixing the lower arm control substrate 2B, the insulation material 3 and the upper arm control substrate 1B on the small-sized power module 4B.

After joint fastening and fixing, similarly to the first exemplary embodiment, the upper arm control terminals C31 to C34 are passed through through holes for control terminal provided in the upper arm protrusion region 16, while the lower arm control terminals C41 to C44 are passed through through holes for control terminal provided in the lower arm protrusion region 26. As a result, front end regions of the upper arm control terminals C31 to C34 are arranged to protrude above the upper arm protrusion region 16 and front end regions of the lower arm control terminals C41 to C44 are arranged to protrude above the lower arm protrusion region 26.

Then, electrical connection between the arm control terminals C31 to C34 and the upper arm parts D31 to D34 (control signal lines electrically connected to terminals of the parts) and electrical connection between the lower arm control terminals C41 to C44 and the lower arm parts D41 to D44 are made by soldering or the like.

The insulation material 3 is inserted between the upper arm control substrate 1B and the lower arm control substrate 2B in such a form and a manner that relative to the upper arm control substrate 1B and the lower arm control substrate 2B, the insulation material overlaps the upper arm main region 15 and the upper arm protrusion region 16 in plan view and does not overlap the upper arm protrusion region 16 and the upper arm protrusion region 17, and the lower arm protrusion region 26 and the lower arm protrusion region 27 in plan view.

As described above, the insulation material 3 exhibits an external shape that enables a sufficient insulation creepage surface to be ensured between the upper arm control substrate 1B (upper arm main region 15) and the lower arm control substrate 2B (lower arm main region 25).

Similar to the upper arm parts D11 to D14 and the lower arm parts D21 to D24, the upper arm parts D31 to D34 and the lower arm parts D41 to D44 are circuit parts to be arranged nearest to the control terminals of the upper arm unit and the lower arm unit, such as a resistor for gate, a chip inductor or the like.

Since it is a common practice for upper and lower arms to use the same semiconductor element, such as IGBT, which configures an inverter unit in a power module, upper and lower arm units have the same arrangement of control terminals. Specifically, in the small-sized power module 4B, among the upper arm control terminals C31 to C34 and the lower arm control terminals C41 to C44 arranged along the left direction (the −X direction), an upper arm control terminal C3$i$ ($i$=any of 1 to 4) and a lower arm control terminal C4$i$ are the terminals of the same kind which transmit and receive a control signal of the same property. As a result, the upper arm control terminals C31 to C34 and the lower arm control terminals C41 to C44 are to be arranged along the left direction (the first direction) on the top surface of the small-sized power module 4B in a common external terminal arrangement order.

On the other hand, since the upper arm control substrate 1B and the lower arm control substrate 2B have the above second control substrate positional relation in which the respective substrates are arranged to be reversed to each other, the substrates should be in conformity with the arrangement of the upper arm control terminals C31 to C34 and the lower arm control terminals C41 to C44.

Figure 5:
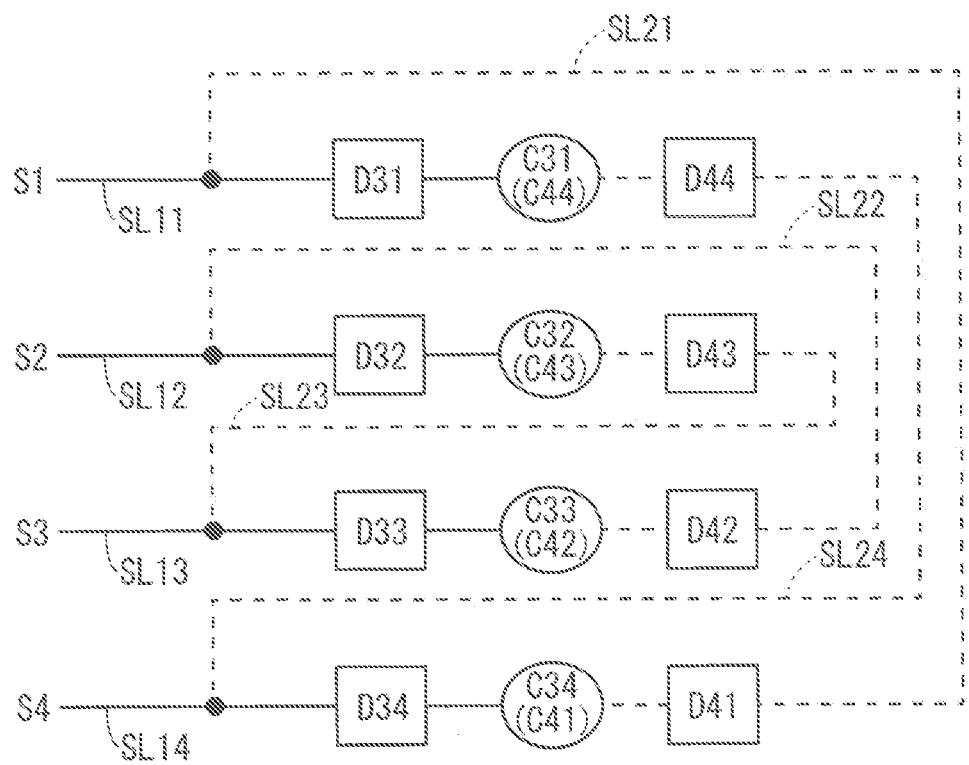
FIG. 5 is an explanatory diagram schematically showing a connection relation between each of the upper and lower arm control substrates and an arm control terminal.

FIG. 5 is an explanatory diagram schematically showing a connection relation between each of the upper arm control substrate 1B and the lower arm control substrate 2B and the arm control terminals C31 to C34. In FIG. 5, assuming that both the upper arm control substrate 1B and the lower arm control substrate 2B are arranged to have the top surfaces facing upward, a connection relation is illustrated between the upper arm parts D31 to D34 and the lower arm parts D41 to D44 provided on the top surfaces and the upper arm control terminals C31 to C34.

In the same figure, control signals S1 to S4 are control signals transmitted and received by the upper arm control circuit or the lower arm control circuit, and correspond to the control signals S51 to S54 in a case where the control circuit unit 50 is assumed to be the upper arm control circuit or the lower arm control circuit and the arm unit 60 is assumed to be the upper arm unit or the lower arm unit in FIG. 3.

Additionally, control signal lines SL11 to SL14 are control signal lines from the upper arm control circuit, which transmit and receive the control signals S1 to S4 to/from the upper arm control terminals C31 to C34, and correspond to the control signal lines SL1 to SL4 in a case where the control circuit unit 50 is assumed to be the upper arm control circuit and the arm unit 60 is assumed to be the upper arm unit in FIG. 3.

In the same manner, control signal lines SL21 to SL24 are control signal lines from the lower arm control circuit assuming that the control signals S1 to S4 are transmitted/received to/from the upper arm control terminals C31 to C34 in a case where the lower arm control substrate 2B is arranged to have the top surface thereof facing upward, and in FIG. 3, the control signal lines correspond to the control signal lines SL1 to SL4 in a case where the control circuit unit 50 is assumed to be the lower arm control circuit and the arm unit 60 is assumed to be the lower arm unit.

First, description will be made of a connection relation between the upper arm control terminals C31 to C34 and the upper arm parts D31 to D34.

The upper arm control substrate 1B is arranged to have the top surface thereof facing upward, and the control signal lines SL11 to SL14 are connected in a normal order manner, i.e. connected to the upper arm control terminals C31 to C34 via the upper arm parts D31 to D34.

Accordingly, the upper arm control substrate 1B is to be arranged such that the upper arm parts D31 to D34 formed on the top surface of the upper arm control substrate 1B with the top surface thereof facing upward and the upper arm control terminals C31 to C34 are electrically connected via the control signal lines SL11 to SL14.

Next, description will be made of a virtual connection relation between the upper arm control terminals C31 to C34 and the lower arm parts D41 to D44.

When assuming that the lower arm control substrate 2B is arranged to have the top surface thereof facing upward, the control signal lines SL21 to SL24 are connected in a reverse order manner, i.e., connected to the lower arm control terminals C34 to C31 via the lower arm parts D41 to D44.

On the other hand, the lower arm parts D41 to D44 formed on the top surface facing downward of the upper arm control substrate 1B, and the lower arm control terminals C41 to C44 have a positional relation in which arrangement orders are reversed to each other in plan view. Specifically, while the lower arm control terminals C41 to C44 are arranged along the left direction (the −X direction) in the order of C41, C42, C43 and C44, the lower arm parts D41 to D44 are arranged along the right direction (the +X direction) in the order of D41, D42, D43 and D44.

However, as described above, since the control signal lines SL21 to SL24 are connected to the upper arm control terminals C31 to C34 in a reverse order manner, the lower arm parts D41 to D44 and the lower arm control terminals C41 to C44 have a positional relation of being electrically connected via the control signal lines SL21 to SL24 as a result.

Specifically, as illustrated in FIG. 5, the lower arm control substrate 2B is arranged on the small-sized power module 4B such that the lower arm parts D41 to D44 and the lower arm control terminals C41 to C44 are electrically connected via the control signal lines SL21 to SL24.

The upper arm main region 15 and the lower arm main region 25 (the first and second main regions) of the upper arm control substrate 1B and the lower arm control substrate 2B (the first and second control substrates), respectively, in the second exemplary embodiment are arranged so as to overlap the insulation material 3 in plan view. Therefore, as a result of layering of the upper arm control substrate 1B and the lower arm control substrate 2B in a manner that large parts of the upper arm main region 15 and the lower arm main region 25 overlap in plan view, an area occupied by the upper arm control substrate 1B and the lower arm control substrate 2B can be decreased to realize a reduction of the device in size as a whole.

In addition, similarly to the first exemplary embodiment, the second exemplary embodiment enables high insulation performance to be ensured between the upper arm control circuit and the lower arm control circuit due to presence of the insulation material 3 arranged between the upper arm control substrate1B and the lower arm control substrate 2B so as to overlap the upper arm main region 15 and the lower arm main region 25 in plan view.

Further, since the upper arm protrusion region 16 and the lower arm protrusion region 26 each do not overlap each other in plan view, and overlap the insulation material 3 in plan view to have an upper part exposed, similarly to the first exemplary embodiment, the upper arm control circuit and the lower arm control circuit having various operation characteristics can be realized with relative ease.

In addition, because the same substrate can be used for the upper arm control substrate 1B and the lower arm control substrate 2B, manufacturing costs of the upper arm control substrate 1B and the lower arm control substrate 2B can be reduced accordingly, thereby cutting a cost of the device as a whole.

Additionally, in the second exemplary embodiment, with the upper arm control substrate 1B and the lower arm control substrate 2B arranged so as to have the top surfaces and back surfaces reversed to each other, the upper arm protrusion region 16 and lower arm protrusion region 26 (the first and second protrusion regions) are arranged in the same direction (rear end portion). Specifically, the upper arm protrusion region 16 and the lower arm protrusion region 26 have a positional relation of protrusion regions in the same direction, in which the protrusion regions are provided at the end portions in the same direction in plan view on the upper arm control substrate 1B and the lower arm control substrate 2B, respectively, without overlapping each other in plan view.

Then, the upper arm control terminals C31 to C34 and the lower arm control terminals C41 to C44 become in conformity with the above positional relation of protrusion regions in the same direction, due to the second external terminal positional relation in which the terminals are provided at an end portion in the same direction in plan view on the top surface of the small-sized power module 4B without overlapping each other in plan view. As a result, electrical connection can be made with relative ease between the upper arm control terminals C31 to C34 and the upper arm parts D31 to D34 provided on the upper arm protrusion region 16 and between the lower arm control terminals C41 to C44 and the lower arm parts D41 to D44 provided on the lower arm protrusion region 26, thereby enabling reduction in a manufacturing cost.

In addition, both the upper arm control substrate 1B and the lower arm control substrate 2B are a one-side mounting substrate in which circuits are mounted only on a top surface thereof, and with a back surface of the upper arm control substrate 1B facing downward and a back surface of the lower arm control substrate 2B facing upward, both the back surfaces of the upper arm control substrate 1B and the lower arm control substrate 2B are arranged on the side of the insulation material 3. Therefore, no space for parts configuring a control circuit needs to be ensured between the upper arm control substrate 1B and the insulation material 3 and between the lower arm control substrate 2B and the insulation material 3, so that the device can be reduced in size accordingly by reducing a size of the device in a height direction.

As described above, since the back surface of the upper arm control substrate 1B faces downward and the back surface of the lower arm control substrate 2B faces upward, it is not necessary to provide the spacer with through hole for screw 23 for reducing a pressure at the time of joint fastening, and in place of the spacer with through hole for screw 23, a through hole similar to the through hole for screw 13 may be formed.

Further, the lower arm parts D41 to D44 (N(=4) second circuit parts) have the control signal lines SL21 to SL24 (N wires) provided in such a manner that a connection relation with the upper arm control terminals C31 to C34 (N first external terminals) is established in a reverse order on the top surface of the lower arm control substrate 2B. Therefore, as a result of arrangement of the top surface of the lower arm control substrate 2B so as to face downward on the small-sized power module 4B, the lower arm parts D41 to D44 and the lower arm control terminals C41 to C44 can be electrically connected via the control signal lines SL21 to SL24.

As a result, the semiconductor device of the second exemplary embodiment is allowed to electrically connect the upper arm control terminals C31 to C34 and the upper arm parts D31 to D34 and connect the lower arm control terminals C41 to C44 and the lower arm parts D41 to D44, respectively, without causing a problem even when the upper arm control substrate 1B and the lower arm control substrate 2B have the second control substrate positional relation in which the top surfaces and the back surface of the substrates are reversed to each other.

Thus, in the semiconductor device according to the second exemplary embodiment, the upper arm control substrate 1B and the lower arm control substrate 2B are provided which can be reduced in size and can be mounted on the small-sized power module 4B as a small-sized two-in-one module having the upper and lower arm control terminals (C31 to C34, C41 to C44) both in the rear end portion.

Additionally, in the small-sized power module 4B, the upper arm unit and the lower arm unit (the first and second partial circuit units) configure single unit of the inverter unit for a single phase. Accordingly, the configuration of the semiconductor device of the second exemplary embodiment as an IPM configuration containing single unit of the inverter unit and the control circuits thereof (the upper arm control circuit and the lower arm control circuit) enables a reduction of the device in size and improvement in insulation performance between the upper arm control circuit and the lower arm control circuit.

(Modification Example)

A multiphase semiconductor device can be realized in which a plurality of the semiconductor devices according to the first exemplary embodiment or the second exemplary embodiment are provided and respective inverter units of the plurality of the semiconductor devices are used as a plurality of inverter units each corresponding to a different phase.

The above multiphase semiconductor device has an IPM configuration containing a plurality of inverter units and a plurality of control circuits (the first and second control circuits) to enable reduction in size of the device and improvement in insulation performance between the upper arm control circuit and the lower arm control circuit.

While the present invention has been shown and described in detail, the foregoing description is in all aspects illustrative and not restrictive. It is therefore understood that numerous modifications examples not illustrated can be assumed without departing from the scope of the invention.

Specifically, the present invention allows the respective exemplary embodiments to be freely combined or appropriately modified or omitted within the scope of the invention.

The invention claimed is:

1. A semiconductor device comprising:
a semiconductor module internally having first and second partial circuit units and externally having first and second external terminals for said first and second partial circuit units;
first and second control substrates which are arranged on said semiconductor module and on which first and second control circuits for said first and second partial circuit units are provided, said first and second control substrates respectively having first and second main regions on which first and second control main portions are formed; and
an insulation material inserted between said first and second control substrates so as to overlap said first and second main regions in plan view,
wherein said first and second control substrates further respectively have first and second protrusion regions in which first and second circuit parts electrically connected to said first and second external terminals are formed,
said first control circuit including said first circuit part and said first control main portion, and said second control circuit including said second circuit part and said second control main portion, and
said first protrusion region does not overlap said second control substrate in plan view, said second protrusion region does not overlap said first control substrate in plan view, and each of said first and second protrusion regions does not overlap said insulation material in plan view.

2. The semiconductor device according to claim 1, wherein
said first and second control substrates have the same plane shape as a whole including said first and second main regions and said first and second protrusion regions, said first and second control substrates having a first control substrate positional relation in which relative to one of the substrates, the other substrate is rotated by 180° in a horizontal direction.

3. The semiconductor device according to claim 2, wherein
said first and second external terminals have a first external terminal positional relation so as to be spaced apart from each other and provided at end portions facing to each other in plan view on said semiconductor module.

4. The semiconductor device according to claim 1, wherein
said first and second control substrates have the same plane shape as a whole including said first and second main regions and said first and second protrusion regions, and
said first and second control substrates have a second control substrate positional relation in which of said first and second control substrates, one control substrate is arranged on said semiconductor module so as to have a top surface thereof facing upward and the other control substrate is arranged on said semiconductor module so as to have a top surface thereof facing downward.

5. The semiconductor device according to claim 4, wherein
said first and second protrusion regions have a positional relation of protrusion regions in the same direction so as to be provided at end portions in the same direction in plan view on said first and second control substrates without overlapping each other in plan view, and
said first and second external terminals have a second external terminal positional relation so as to be provided at end portions in the same direction in plan view on said semiconductor module without overlapping each other in plan view.

6. The semiconductor device according to claim 5, wherein
said first and second control substrates and said insulation material are layered to be arranged in the order of said second control substrate, said insulation material and said first control substrate,
said first and second control substrates are a one-side mounting substrate having a top surface on which said first and second control main portions and said first and second circuit parts are mounted, and having a back surface on which no circuit is provided, and
said second control substrate positional relation is a positional relation in which said first control substrate is arranged on said semiconductor module so as to have a top surface thereof facing upward and said second control substrate is arranged on said semiconductor module so as to have a top surface thereof facing downward.

7. The semiconductor device according to claim 6, wherein
said first and second external terminals respectively include N(≥2) first external terminals and N(≥2) second external terminals arranged along a first direction on a top surface of said semiconductor module, said N first and second external terminals being configured with terminals of the same kind which correspond to each other on a one-to-one basis,
said first and second circuit parts respectively include N first circuit parts and N second circuit parts arranged along said first direction, said N first and second circuit parts being configured with parts of the same kind which correspond to each other on a one-to-one basis,
said N first and second external terminals are arranged along said first direction on the top surface of said semiconductor module in a common external terminal arrangement order,
said N first and second circuit parts are arranged along said first direction on the top surfaces of said first and second control substrates in a common circuit part arrangement order, and
said second control substrate, when arranged to have the top surface thereof facing upward, has N wires provided to make reversed a connection relation between said N second circuit parts and said N first external terminals.

8. The semiconductor device according to claim 1, wherein
said first partial circuit unit is a high-voltage side upper arm unit having a power semiconductor element and said second partial circuit unit is a low-voltage side lower arm unit having a power semiconductor element, said upper arm unit and said lower arm unit configuring single unit of an inverter unit for a single phase.

9. A multiphase semiconductor device having a plurality of inverter units for a multiphase, comprising:
a plurality of the semiconductor devices according to claim 8,
wherein a plurality of said single units of the inverter units of the plurality of the semiconductor devices are used as said plurality of inverter units.

* * * * *